(12) United States Patent
Abd Hamid et al.

(10) Patent No.: US 10,651,109 B2
(45) Date of Patent: May 12, 2020

(54) SELECTIVE PLATING OF SEMICONDUCTOR PACKAGE LEADS

(71) Applicant: Infineon Technologies AG, Neubiberg (DE)

(72) Inventors: Syahir Abd Hamid, Melaka (MY); Jagen Krishnan, Melaka (MY); Mian Mian Lam, Sarawak (MY); Jayaganasan Narayanasamy, Melaka (MY); Fabian Schnoy, Regenstauf (DE); Thomas Stoek, Buxtehude (DE); Christian Stuempfl, Schmidgaden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/504,692

(22) Filed: Jul. 8, 2019

(65) Prior Publication Data
US 2020/0020607 A1 Jan. 16, 2020

Related U.S. Application Data

(63) Continuation-in-part of application No. 16/036,354, filed on Jul. 16, 2018.

(51) Int. Cl.
*H01L 23/373* (2006.01)
*H01L 23/495* (2006.01)
(Continued)

(52) U.S. Cl.
CPC ...... *H01L 23/3736* (2013.01); *H01L 21/4825* (2013.01); *H01L 21/4882* (2013.01);
(Continued)

(58) Field of Classification Search
CPC ..... H01L 23/3736; H01L 23/34; H01L 23/28; H01L 23/3107; H01L 23/49551;
(Continued)

(56) References Cited

U.S. PATENT DOCUMENTS 9,966,329 B2 * 5/2018 Shimizu ............... H01L 21/561
10,103,036 B2 10/2018 Tanoue et al.
(Continued)

OTHER PUBLICATIONS

Unknown, Author, "Electroplating", https://en.wikipedia.org/wiki/Electroplating, Accessed Jun. 18, 2018, Jun. 13, 2018, 1-8.
(Continued)

*Primary Examiner* — Jose R Diaz
(74) *Attorney, Agent, or Firm* — Murphy, Bilak & Homiller, PLLC (57) ABSTRACT

A method of forming a semiconductor device includes providing a semiconductor package comprising an electrically insulating mold compound body, a semiconductor die that is encapsulated by the mold compound body, a plurality of electrically conductive leads that each protrude out of the mold compound body, and a metal heat slug, the metal heat slug comprising a rear surface that is exposed from the mold compound body, coating outer portions of the leads that are exposed from the mold compound body with a metal coating, and after completing the coating of the outer portions of the leads, providing a planar metallic heat sink interface surface on the semiconductor device which is exposed from the mold compound body, and substantially devoid of the metal coating.

24 Claims, 9 Drawing Sheets

(51) Int. Cl.
*H01L 21/48* (2006.01)
*H01L 23/367* (2006.01)
*H01L 21/56* (2006.01)
*H01L 23/31* (2006.01)

(52) U.S. Cl.
CPC ........ *H01L 21/565* (2013.01); *H01L 23/3107* (2013.01); *H01L 23/367* (2013.01); *H01L 23/49517* (2013.01); *H01L 23/49568* (2013.01); *H01L 23/49582* (2013.01)

(58) Field of Classification Search
CPC ......... H01L 23/49555; H01L 23/49579; H01L 23/49582; H01L 2023/4037–4068; H01L 21/56
See application file for complete search history.

(56) References Cited

U.S. PATENT DOCUMENTS

2016/0289443 A1* 10/2016 Iwatani .................. C08L 63/00
2018/0096961 A1* 4/2018 Hashizume ............. H01L 24/32

OTHER PUBLICATIONS

Unknown, Author, "Soldering and Mounting Techniques", ON Semiconductor, SOLDERRM/D, Rev. 11, Mar. 2016, 1-83.

* cited by examiner

SELECTIVE PLATING OF SEMICONDUCTOR PACKAGE LEADS

PRIORITY CLAIM

This application is a continuation-in-part of and claims priority to U.S. application Ser. No. 16/036,354 filed Jul. 16, 2018, the content of which is incorporated by reference herein in its entirety.

TECHNICAL FIELD

The instant application relates to semiconductor packaging, and particularly relates to techniques for forming metal coatings on semiconductor package leads.

BACKGROUND

In many modern applications, semiconductor chips generate a substantial amount of heat during operation. This heat must be effectively dissipated away from the semiconductor chip to maintain the operational temperature of the chip at acceptable limits. For this reason, heat sinks are often secured to an exterior surface of the packaged device. Heat sinks are configured to extract hear from the packaged device and to efficiently dissipate the extracted heat, thereby lowering the temperature of the packaged device.

In some applications, the interface between the heat sink and the outer surface of the package can be a source of inefficiency. This interface can be substantially thermally resistive, which decreases the ability of the heat sink to extract heat from the packaged device.

SUMMARY

A method of forming a semiconductor device is disclosed. According to an embodiment, the method includes providing a semiconductor package comprising an electrically insulating mold compound body, a semiconductor die that is encapsulated by the mold compound body, a plurality of electrically conductive leads that each protrude out of the mold compound body, and a metal heat slug, the metal heat slug comprising a rear surface that is exposed from the mold compound body, coating outer portions of the leads that are exposed from the mold compound body with a metal coating, and after completing the coating of the outer portions of the leads, providing a planar metallic heat sink interface surface on the semiconductor device which is exposed from the mold compound body, and substantially devoid of the metal coating.

Separately or in combination, the planar metallic heat sink interface surface and the electrically conductive leads are each formed from a first metal, and the metal coating comprises a second metal having higher solderability than the first metal.

Separately or in combination, the planar metallic heat sink interface surface and the electrically conductive leads are each formed from copper, and the metal coating comprises at least one of: gold, nickel, tin, and silver.

Separately or in combination, the planar metallic heat sink interface surface is provided by the rear surface of the heat slug, coating the outer portions of the leads comprises an electroplating process, and providing the planar metallic heat sink interface surface to be substantially devoid of the metal coating comprises preventing the electroplating process from depositing the metal coating on the rear surface of the heat slug.

Separately or in combination, the lead frame is provided to include a peripheral ring and a tie bar, each of the leads being connected to the peripheral ring and physically separated from the heat slug, the tie bar being connected between the peripheral ring and the heat slug, and preventing the electroplating process from depositing the metal coating on the rear surface of the heat slug comprises severing the tie bar prior to performing the electroplating process.

Separately or in combination, the lead frame is provided to include a peripheral ring with at least one of the leads being physically connected between the peripheral ring and the heat slug, and preventing the electroplating process from depositing the metal coating on the rear surface of the heat slug comprises applying a non-conductive coating on the rear surface of the heat slug prior to performing the electroplating process.

Separately or in combination, providing the planar metallic heat sink interface surface comprises providing a metallic attachment piece that is separate from the heat slug, and attaching the metallic attachment piece to the rear surface of the heat slug after coating the outer portions of the leads with the metal coating.

Separately or in combination, coating the outer portions of the leads comprises an electroplating process, the electroplating process forms the metal coating on the rear surface of the heat slug, and the metallic attachment piece completely covers the metal coating on the rear surface once attached to the heat slug.

Separately or in combination, attaching the metallic attachment piece to the rear surface comprises directly affixing the metallic attachment piece to the rear surface such that a lower side of the metallic attachment piece interfaces with and covers the rear surface of the heat slug, an upper side of the metallic attachment piece that is opposite from the lower side provides the planar metallic heat sink interface surface.

Separately or in combination, the lower side of the attachment piece comprises a first set of attachment features, the rear surface of the heat slug comprises a second set of attachment features, the first and second sets of attachment features are complementary shaped, and the attachment piece is secured to the heat slug by forming an interlocked connection between the first and second sets of attachment features.

Separately or in combination, the metal coating forms directly on the rear surface of the heat slug during the coating of the outer portions of the leads, and providing the planar metallic heat sink interface comprises removing the metal coating that forms directly on the rear surface of the heat slug Separately or in combination, removing the metal coating that forms directly on the rear surface of the heat slug comprises performing a laser removal process that removes the metal coating with a laser beam.

Separately or in combination, the metal coating is removed from a central portion of the heat slug such that a ring of the metal coating that extends to outer edges of the heat slug remains on the heat slug after the laser removal process.

Separately or in combination, the metal coating is completely removed from the heat slug.

According to another embodiment, the method includes providing a semiconductor package comprising an electrically insulating mold compound body, a semiconductor die that is encapsulated by the mold compound body, a plurality of electrically conductive leads that each protrude out of the mold compound body, and a metal heat slug, the metal heat slug comprising a rear surface that is exposed from the mold compound body. An electroplating process is performed on the semiconductor package that forms a metal coating on the outer portions of the leads that are exposed from the mold compound body. The metal coating is prevented from forming on the rear surface of the heat slug during the electroplating process.

Separately or in combination, performing the electroplating process comprises submerging the leads and the rear surface of the semiconductor package in an aqueous solution, and preventing the metal coating from forming on the rear surface comprises electrically disconnecting the heat slug from the leads before performing the electroplating process.

Separately or in combination, the semiconductor package is provided on a lead frame comprising a peripheral ring and a tie bar, each of the leads being connected to the peripheral ring and disconnected from the hear slug, the tie bar being connected between the peripheral ring and the heat slug, and electrically disconnecting the heat slug from the leads comprises severing the tie bar.

Separately or in combination, preventing the metal coating from forming on the rear surface of the hear slug comprises applying a non-conductive adhesive on the on the rear surface of the heat slug prior to performing the electroplating process.

A packaged semiconductor device is disclosed. The packaged semiconductor device includes an electrically insulating mold compound body. The packaged semiconductor device further includes a metal heat slug having a rear surface that is exposed from the mold compound body and a die attach surface opposite the rear surface. The packaged semiconductor device further includes a semiconductor die that is encapsulated by the mold compound body and mounted on the heat slug. The packaged semiconductor device further includes a plurality of electrically conductive leads, each of the leads comprising outer portions that are exposed from the mold compound body. The packaged semiconductor device further includes a metal coating covering the outer portions of each of the leads. The packaged semiconductor device further includes a planar metallic heat sink interface surface which is exposed from the mold compound body, thermally coupled to the semiconductor die via the heat slug, and substantially devoid of the metal coating.

Separately or in combination, the planar metallic heat sink interface surface and the electrically conductive leads are each formed from a first metal, and the metal coating comprises a second metal having higher solderability than the first metal.

Separately or in combination, the rear surface of the heat slug provides the planar metallic heat sink interface surface.

Separately or in combination, the semiconductor package further comprises a metallic attachment piece that is separate from the heat slug and is secured to the heat slug at its lower side, and wherein an upper side of the metallic attachment piece provides the planar metallic heat sink interface surface Separately or in combination, the metal coating is additionally formed on the rear surface of the heat slug in a ring that surrounds a central portion of the heat slug which is exposed form the metal coating.

Separately or in combination, the semiconductor package further comprises a groove formed in the mold compound body, the groove surrounds the rear surface of the heat slug, and the rear surface of the heat slug is completely devoid of the metal coating.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes

FIG. 5, which includes

FIG. 6, which includes FIGS. 6A, 6B and 60, depicts a packaged semiconductor device with a heat sink interface that is devoid of the metal coating formed on the package leads and at least one lead directly connected to the heat slug, according to an embodiment.

FIG. 9, which includes

DETAILED DESCRIPTION

According to embodiments described herein, a semiconductor package with a semiconductor die that is encapsulated by an electrically insulating mold compound body is provided. The semiconductor package includes a plurality of leads exposed from the mold compound body. Additionally, a rear surface of a metal heat slug to which the semiconductor die is mounted is exposed from the mold compound body. Once the semiconductor package is provided, an electroplating process is used to form a metal coating on the leads. Advantageously, processing steps are described herein to form a metallic heat sink interface surface on the exterior of the package that is devoid of the metal coating on the leads. According to some techniques, measures are taken prior to the electroplating process to prevent the metal coating from forming on the rear surface of the heat slug during electroplating. In that case, the rear surface of the heat slug can directly provide the metallic heat sink interface surface that is devoid of the metal coating. According to other techniques, an additional metal piece is secured to the rear surface of the heat slug after performing the electroplating process. In that case, the additional metal piece can provide the metallic heat sink interface surface that is devoid of the metal coating.

Figure 1:
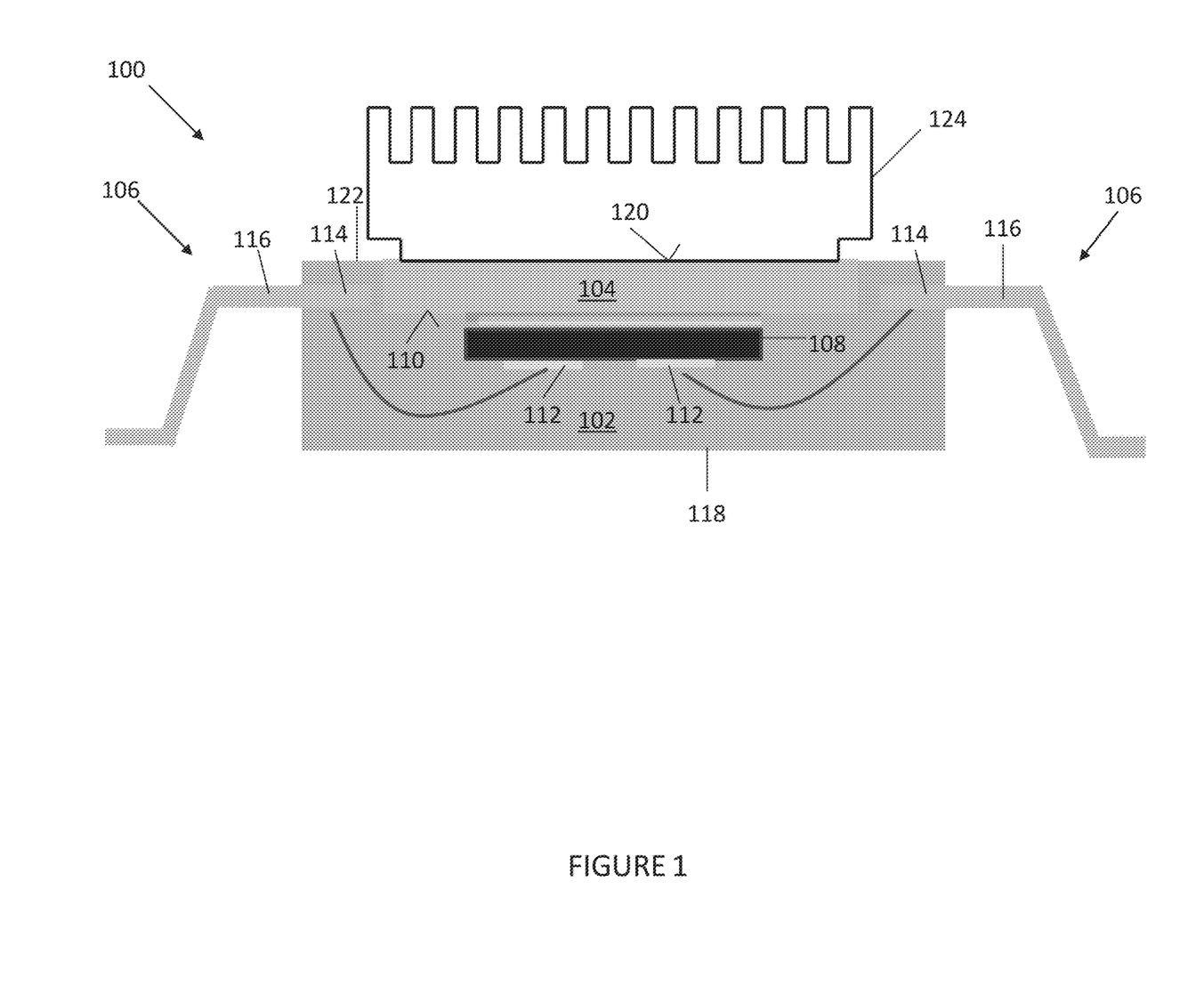
FIG. 1 depicts a packaged semiconductor device, according to an embodiment.

Referring to FIG. 1, a semiconductor package 100 is depicted, according to an embodiment. The semiconductor package 100 includes an electrically insulating mold compound body 102, a metal heat slug 104 and a plurality of electrically conductive leads 106. A semiconductor die 108 is mounted on a die attach surface 110 of the heat slug 104.

Generally speaking, the semiconductor die 108 can have a wide variety of device configurations. For example, the semiconductor die 108 can be configured as a discrete device, e.g., metal oxide semiconductor field effect transistor (MOSFE)T, insulated gate bipolar transistor (IGBT), diode, thyristor, etc. Alternatively, the semiconductor die 108 can be configured as an integrated circuit, processor, controller, amplifier, etc. The semiconductor die 108 includes conductive input/output terminals 112 (e.g., gate, source, drain, etc.) that are electrically connected to the leads 106. In the depicted embodiment, this electrical connection is provided by conductive bond wires. More generally, this electrical connection can be provided according to any commonly known technique, e.g., ribbons, clips, etc.

The mold compound body 102 is formed from an electrically insulating material. Exemplary materials for the mold compound body 102 include any of a wide variety of encapsulant materials, e.g., ceramic, plastic, resin, epoxy, etc. The mold compound body 102 is formed to encapsulate the semiconductor die 108 and the associated electrical connections between the semiconductor die 108 and the leads 106. In this way, the packaged elements are protected from the exterior environment.

The leads 106 include inner portions 114 and outer portions 116. The inner portions 114 of the leads 106 are encapsulated by the mold compound body 102 and provide a connection point for terminals 112 of the semiconductor die 108. The outer portions 116 of the leads 106 are exposed from the mold compound body 102 and provide external electrical access to the terminals 112 of the semiconductor die 108.

In the depicted example, the outer portions 116 of the leads 106 extend laterally away from the package sidewalls and bend downward towards to reach a bottom side 118 of the semiconductor package 100. This lead configuration produces a so-called "surface-mount" package type configuration. This represents just one exemplary package configuration. More generally, the semiconductor package 100 can have a wide variety of package configurations, e.g., through hole, flat, surface mount, etc., and the techniques described herein are applicable to any of these package configurations.

The heat slug 104 is formed from a thermally conductive material including metals such as copper, aluminum, etc., and alloys thereof. A rear surface 120 of the heat slug 104 is exposed from the mold compound body 102. In this example, the rear surface 120 of the heat slug 104 is exposed at a top side 122 of the package, i.e., the side of the package that is opposite from the bottom side 118. This provides a so-called top-side cooling configuration wherein heat is drawn away from the top side 122 of the semiconductor package 100 during operation of the device. A heat sink 124 can be mounted on the rear surface 120 of the heat slug 104 in this configuration. As a result, the heat sink 124 is directly thermally coupled to the semiconductor die 108 via the heat slug 104. In another package configuration, the heat slug 104 can be arranged such that the rear surface 120, i.e., the surface opposite from the semiconductor die 108, is exposed at the bottom side 118 of the semiconductor package 100. This style package can be mounted with a heat sink underneath it so that heat can be drawn away in a similar manner.

Figure 2:
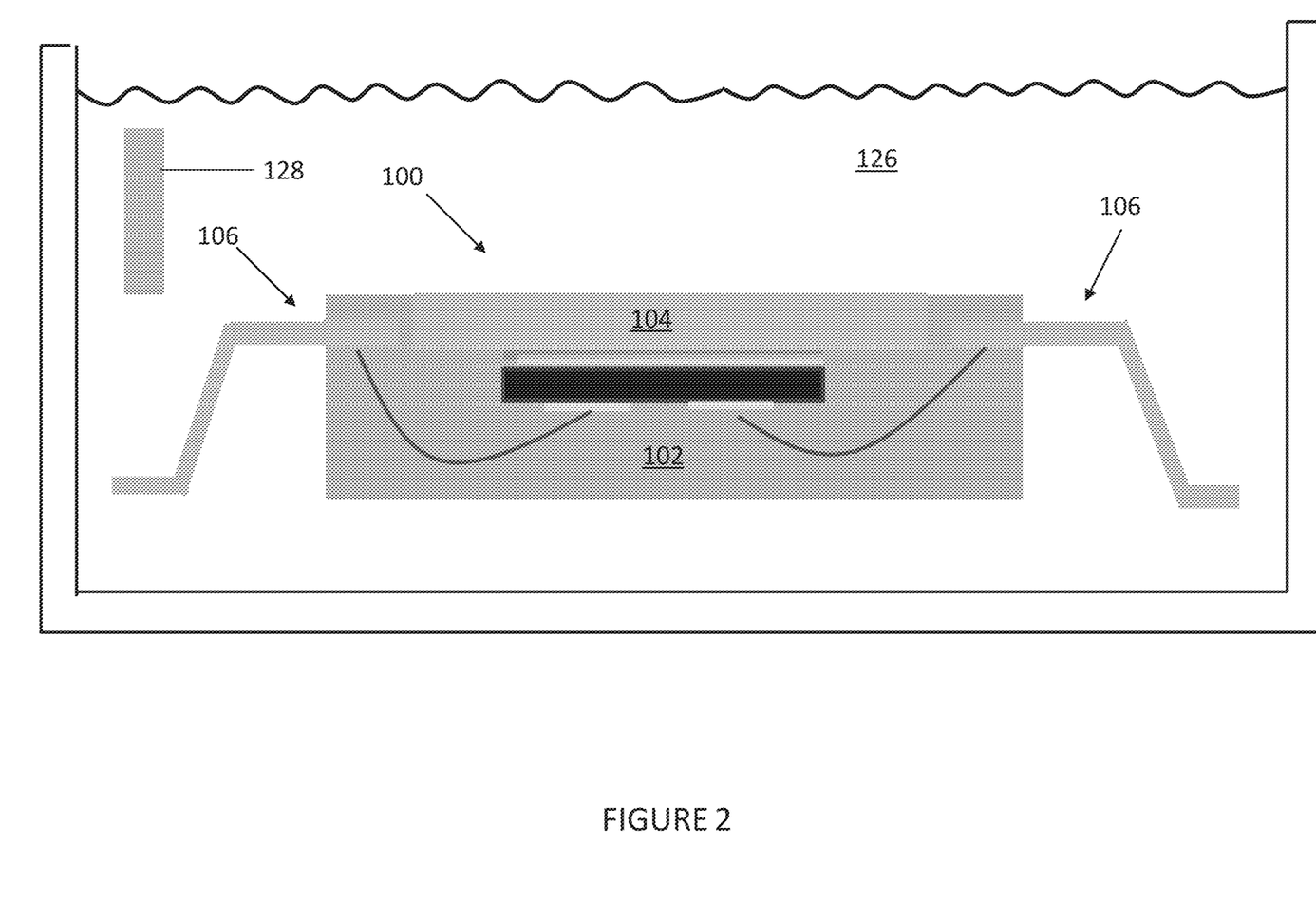
FIG. 2 depicts an electroplating process for forming a metal coating on the leads of the packaged semiconductor device, according to an embodiment.

Referring to FIG. 2, an electroplating process is performed on the semiconductor package 100. Electroplating refers to any process in which electrical current is used to form a thin metal coating on the exterior surfaces of the electrified element. According to this technique, the semiconductor package 100 is submerged in an aqueous based solution 126. The aqueous based solution 126 is a chemical solution containing cations of a metal to be deposited. A cathode 128 is submerged in the aqueous based solution 126 and a potential difference is created between the submerged cathode and a submerged conductive article (which acts as an anode). In this case, the exposed portions of the leads 106 and the rear surface 120 of the heat slug 104 are submerged in the aqueous based solution 126 and therefore represent potential surfaces to which a metal can be deposited on by the electroplating process.

Figure 3:
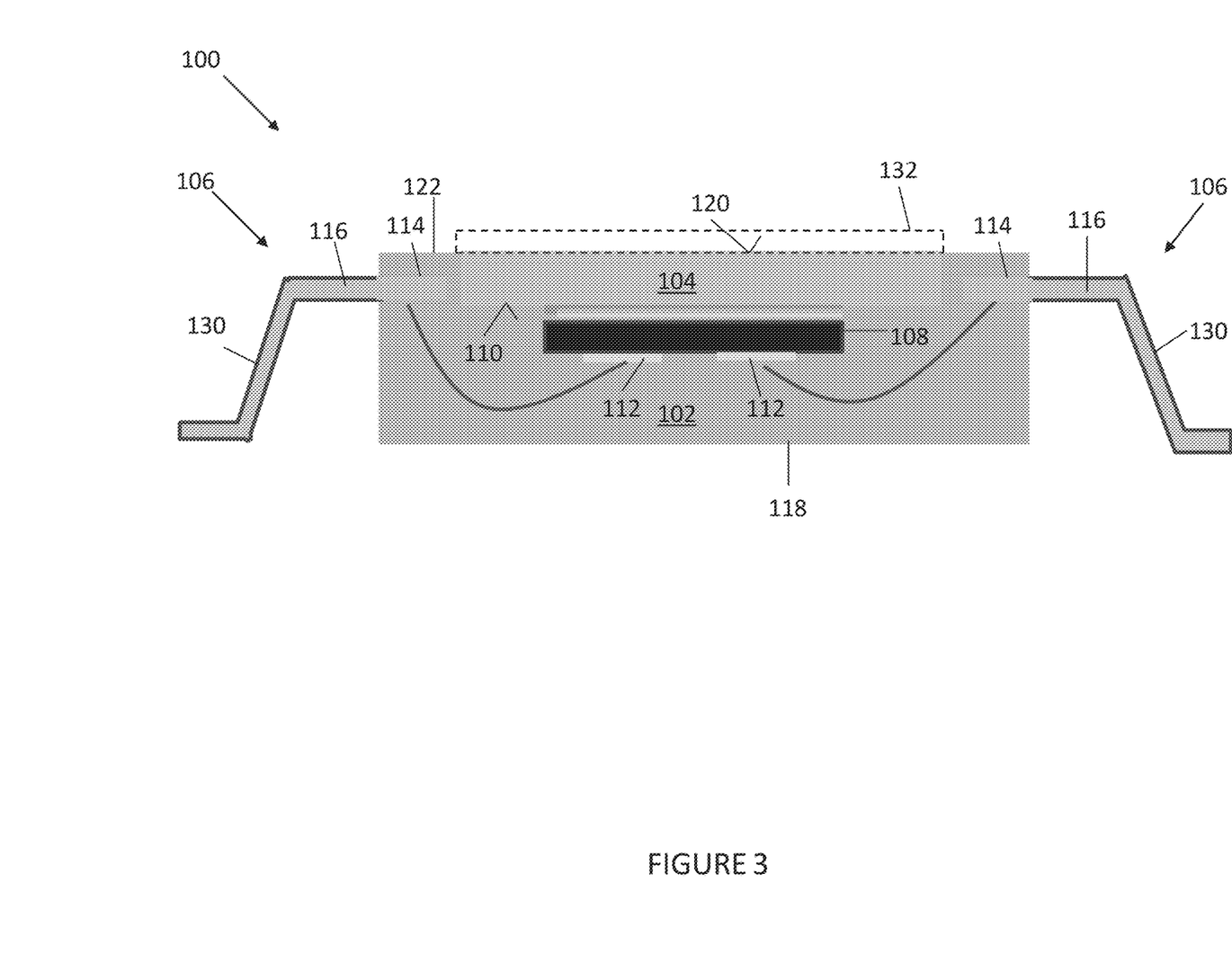
FIG. 3 depicts a packaged semiconductor device with a heat sink interface that is devoid of the metal coating that is formed on the package leads, according to an embodiment.

Referring to FIG. 3, the semiconductor package 100 is shown after performing the electroplating process. The electroplating process is performed such that the outer portions 116 of the leads 106 that are exposed from the mold compound body 102 are coated with a metal coating 130. The electroplating process causes the metal coating 130 to completely cover the leads 106 such that the underlying material of the leads 106 is not exposed.

According to an embodiment, the leads 106 are formed from a first metal and the metal coating 130 is a second metal that is different from the first metal. Generally speaking, the metal coating 130 can include any material that produces some benefit with respect to the surface properties of the leads 106, e.g., solderability, corrosion protection, adhesion, conductivity, etc. That is, the metal coating 130 can be selected so that the leads 106 are more easily soldered to a printed circuit in comparison to a package without the metal coating. In addition, the metal coating 130 can be selected to provide a degree of corrosion protection for the leads 106. Alternatively, the first and second metals can include similar or identical materials.

According to an embodiment, the metal coating 130 has a higher solderability than the underlying material of the leads 106. Solderability refers to the capability of a material be soldered to another element via solder. The degree of solderability as used herein can be determined using EIA/JEDEC J-STD-002, the content of which is incorporated by reference in its entirety. Factors that influence solderability include wettability (i.e. surface tension) with solder material and the presence or lack thereof of oxides on the surface of the material. Generally speaking, coatings that are well suited for solderability and corrosion protection include tin coatings, silver coatings, gold coatings, nickel coatings, and alloys thereof. These coatings have higher solderability than copper or aluminum, which are common package lead materials. In one specific example, the leads 106 and the heat slug 104 are formed from copper, and the metal coating 130 is a silver or silver-based coating.

The inventors have observed that the above described metal coating 130, although advantageous when provided on the leads 106, can be detrimental when applied to the rear surface 120 of the heat slug 104. In particular, this metal coating 130 can create problems with respect to the connection between the heat sink 124 and the heat slug 104, e.g., as shown in the example of FIG. 1. The heat sink 124 can be attached to the heat slug 104 using a soldering technique or using a polymer based thermal interface material. Although the metal coating 130 is generally designed to enhance solderability of the leads 106 to an external apparatus, e.g., a printed circuit board, this benefit is not correspondingly obtained when soldering the heat slug 104 to a heat sink 124 or attaching the hear slug 104 to a heat sink using a polymer based thermal interface material. Different to the soldering of the leads 106, the soldering of the heat sink 124 involves the application of a greater amount of liquified solder material over a larger surface area. During solder reflow, the large amount of metal coating 130 that is present on the rear surface 120 of the hear slug 104 becomes unevenly distributed with large accumulations in some areas and bare spots in other areas. Put another way, the substantial difference in physical attributes between the leads 106 and the heat slug 104 means that the metal coating 130 is not generically beneficial on the rear surface 120 of the heat slug 124.

FIG. 3 schematically depicts a planar metallic heat sink interface surface 132 on the semiconductor package 100 which avoids the above described drawbacks of forming the metal coating 130 on the rear surface 120. The planar metallic heat sink interface surface 132 is thermally coupled to the semiconductor die 108 via the heat slug 104. This means that the planar metallic heat sink interface surface 132 has a low thermal resistance connection to the semiconductor die 108, which is at least partially provided by the heat sink 124. Further, the planar metallic heat sink interface surface 132 is substantially devoid of the metal coating 130. This means that a significant majority, e.g., greater than seventy five percent, of a surface area of the planar metallic heat sink interface surface 132 is not covered by the metal coating 130. In some embodiments, the planar metallic heat sink interface surface 132 is completely devoid of the metal coating 130. Further, the planar metallic heat sink interface surface 132 is exposed from the mold compound body 102. Thus, the planar metallic heat sink interface surface 132 is externally accessible for the provision and connection to a heat sink 124, e.g., in a similar manner depicted in FIG. 1.

The methods described herein allow for the planar metallic heat sink interface surface 132 to be provided with the above described attributes after coating the outer portions 116 of the leads 106 with the metal coating 130, e.g., according to the above described electrodeposition technique. Thus, the methods described herein allow for the provision of the metal coating 130 on the outer portions 116 of the leads 106 without providing the metal coating 130 at the interface between the heat sink 124 and the semiconductor package 100, thus avoiding the issue of unevenly distributed coating material as previously described. In some examples, the planar metallic heat sink interface surface 132 can be provided by the rear surface 120 of the heat slug 104. Alternatively, the planar metallic heat sink interface surface 132 can be a separate structure that is attached to the heat slug 104. In either case, the planar metallic heat sink interface surface 132 is thermally coupled to the semiconductor die 108 within the meaning of the present specification and thus provides a surface for the mounting of a heat sink 124 thereon.

Referring to FIG. 4, two different configurations for the semiconductor package 100 are shown, and a corresponding lead frame 134 that can be used to form these different configurations for the semiconductor package 100 are shown, according to an embodiment.

Figure 4A:
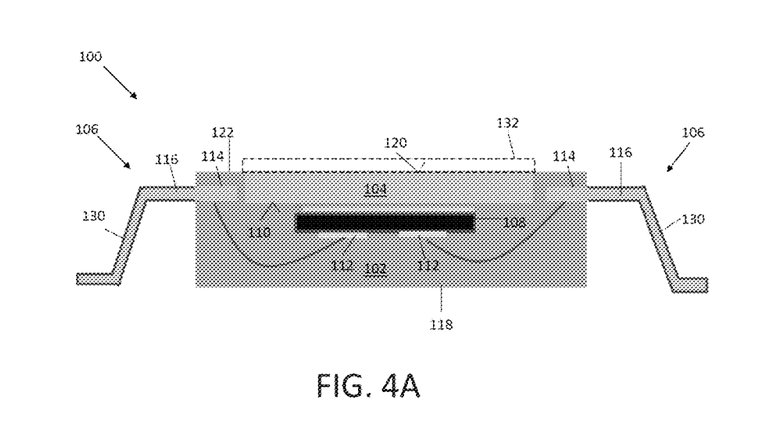
FIGS. 4A, 4B, 4C and 4D, depicts a technique for preventing the electroplating process from forming the metal coating on the rear surface of the heat slug, according to an embodiment.
Figure 4B:
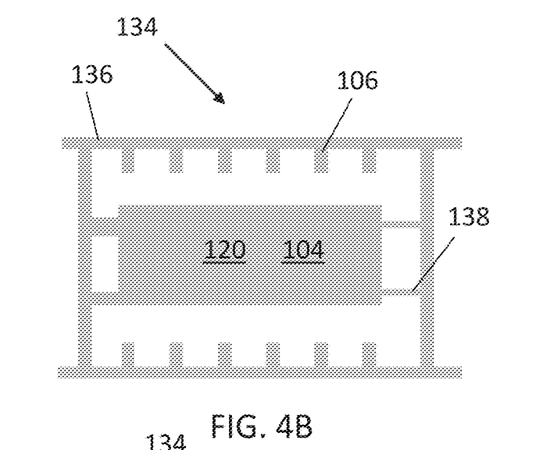

FIG. 4A depicts the semiconductor package 100 as previously described with reference to FIG. 1. FIG. 4B depicts a lead frame 134 that is used to form this semiconductor package 100, according to an embodiment. The lead frame 134 includes each of the leads 106 and the heat slug 104 of the semiconductor package 100. The lead frame 134 includes a peripheral ring 136 that forms an enclosed circle around the heat slug 104. Each of the leads 106 are directly connected to the peripheral ring 136 (e.g., by an integral physical connection). Moreover, each of the leads 106 are disconnected from the heat slug 104. That is, ends of the leads 106 are physically spaced apart from the from the heat slug 104. The lead frame 134 additionally includes tie bars 138 that extend directly between and physically connect to (e.g., by an integral physical connection) the heat slug 104 and the peripheral ring 136.

Figure 4C:
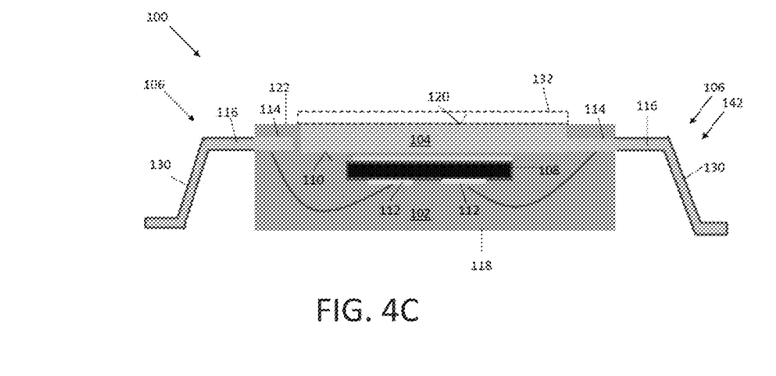
Figure 4D:
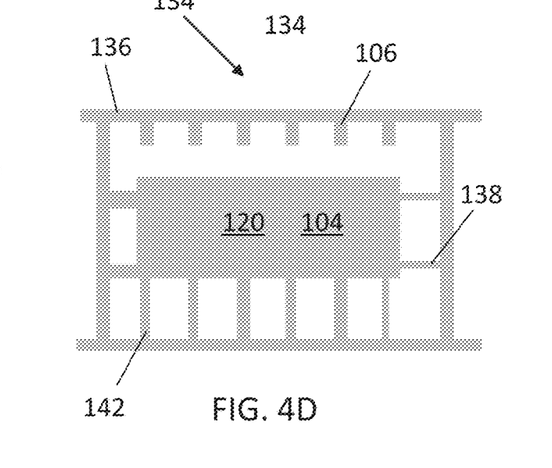

FIG. 4O depicts the semiconductor package 100, according to another embodiment. The semiconductor package 100 of FIG. 4O is identical to the package described with reference to FIG. 1, with the following exception. Whereas all of the leads 106 in the package of FIG. 1 are physically separated from the heat slug 104, the semiconductor package 100 of FIG. 4O includes a first one 142 of the leads 106 that is directly physically connected to the heat slug 104. In one example, the heat slug 104 provides a reference potential (e.g., GND) connection to the semiconductor die 108 and the first one 142 of the leads 106 provides an external terminal for this reference potential. This configuration may require at least one of the leads 106 from the lead frame 134 (e.g., as shown in FIG. 4) to be connected between the peripheral ring 136 and the heat slug 104. That is, different to the previously described embodiment, at least one of the leads 106 physically contacts the heat slug 104, thereby providing the configuration as shown in FIG. 4C. FIG. 4F depicts a lead frame 134 that is used to form this semiconductor package 100 of FIG. 4O, according to an embodiment. The lead frame 134 of FIG. 4D can be substantially similar or identical to the lead frame 134 of FIG. 4B, with the exception that at least one of the leads 106 extends directly from the peripheral ring 136 to the heat slug 104 thereby providing the first one 142 of the leads 106 as previously described.

Figure 5A:
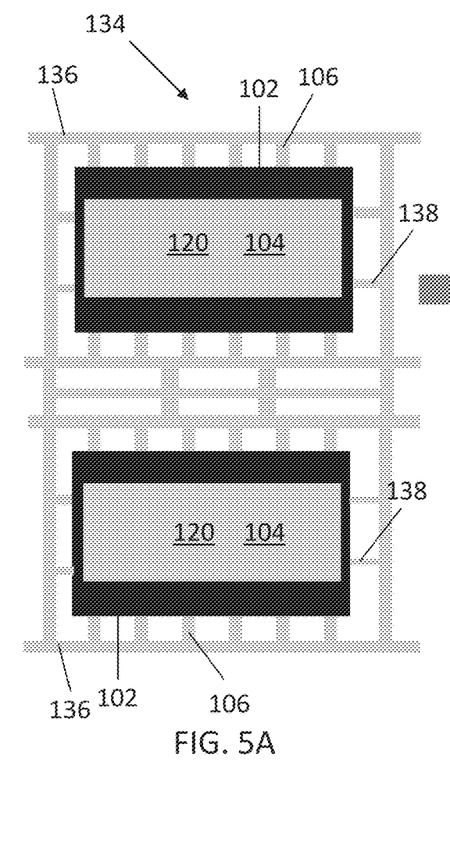
FIGS. 5A, 5B and 5C, depicts a technique for preventing the electroplating process from forming the metal coating on the rear surface of the heat slug, according to an embodiment.
Figure 5B:
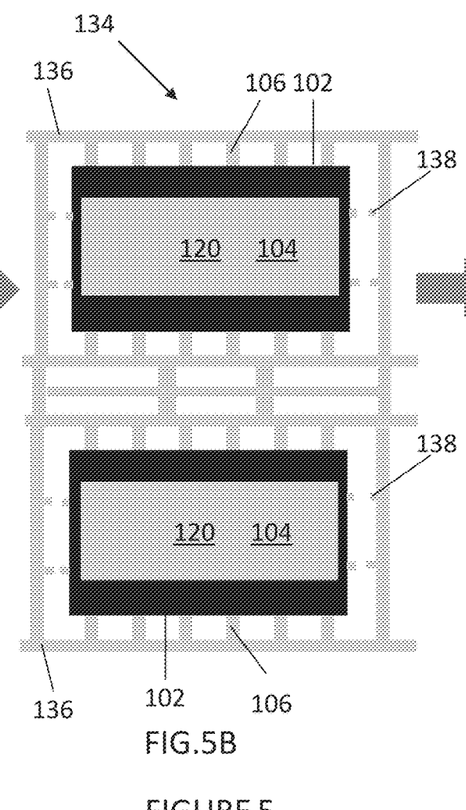

Referring to FIG. 5, a technique for preventing the electroplating process from depositing the metal coating 130 on the rear surface 120 of the heat slug 104 is shown, according to one embodiment. According to this technique, a lead frame 134 is provided. The lead frame may be substantially similar or identical to the lead frame 134 described with reference to FIG. 5B.

FIG. 5A shows the lead frame 134 with the mold compound body 102 formed over the heat slug 104. Prior to this step, the semiconductor die 108 is mounted on the die attach surface 110 and the bond wires are formed using, e.g., commonly known techniques. Subsequently, the encapsulation step is performed to form the mold compound body 102. This can be done using a variety of techniques, such as injection molding, transfer molding, and lamination, to name a few. Once the encapsulation material hardens, the heat slug 104 is physically supported by the leads 106. As a result, the tie bar 138 is no longer necessary to physically support the heat slug 104.

Referring to FIG. 5B, each of the tie bars 138 is severed. This can be done as soon as the mold compound body 102 is hardened. By severing the tie bars 138, the heat slug 104 becomes electrically disconnected from the peripheral ring 136 and consequently from each of the leads 106.

Figure 5C:
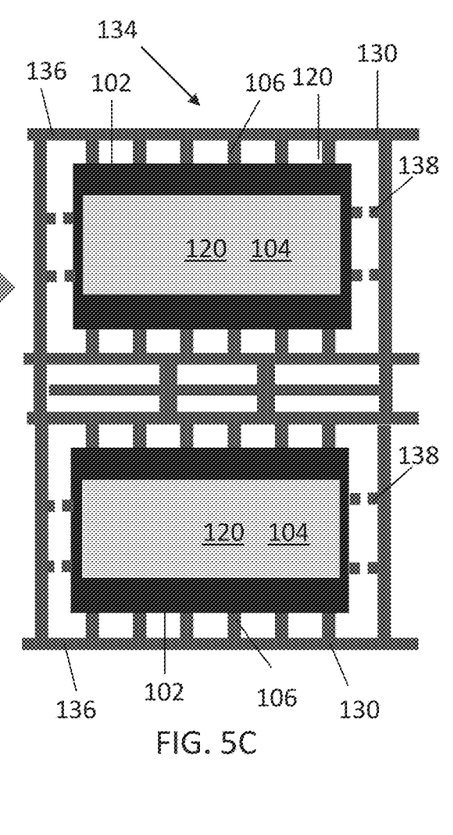

Referring to FIG. 5O, the metal coating 130 is formed on the leads 106 by an electroplating process. According to this process, the leads 106 and the peripheral ring 136 are energized with an electricity source while being submerged in an aqueous solution. e.g., according to the technique described with reference to FIG. 2. As a result, the metal coating 130 is deposited on the leads 106. Meanwhile, the cations in the aqueous based solution 126 do not deposit on the rear surface 120 of the heat slug 104 because the heat slug 104 is disconnected from the electricity source that energizes the leads 106. Thus, the severing of the leads 106 prevents the electroplating process from depositing the metal coating 130 on the rear surface 120 of the heat slug 104.

Referring to FIG. 6, a technique for preventing the electroplating process from depositing the metal coating 130 on the rear surface 120 of the heat slug 104 is shown, according to another embodiment. In this example, a lead frame 134 is provided. The lead frame 134 may be substantially similar or identical to the lead frame 134 described with reference to FIG. 4A or the lead frame 134 described with reference to FIG. 4O. After providing the lead frame 134, the semiconductor die 108 is encapsulated, e.g., according to the previously described techniques.

Figure 6A:
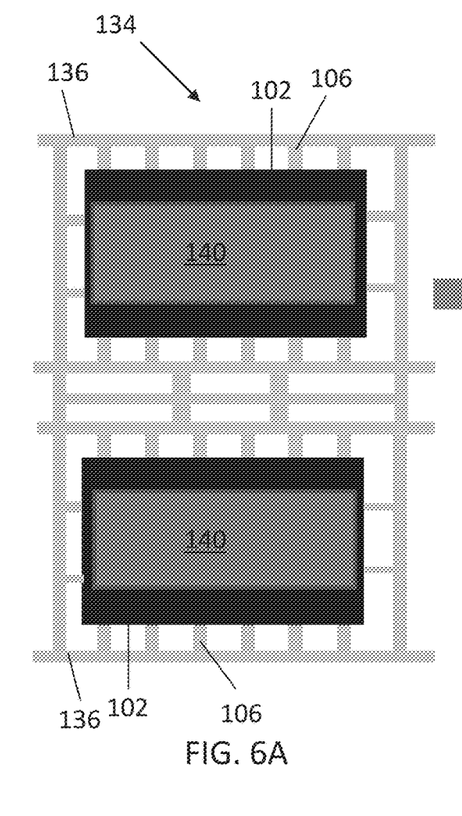

Referring to FIG. 6A, a non-conductive coating 140 is applied to the rear surface 120 of the heat slug 104. According to an embodiment, the non-conductive coating 140 covers at least 95 percent of the rear surface 120 of the heat slug 104. Generally speaking, the non-conductive coating 140 can be any of a wide variety of materials that can be formed to cover the rear surface 120 of the heat slug 104 and are electrical insulating. Examples of these materials include adhesives, lacquers and epoxies, to name a few. In some embodiments, the non-conductive coating 140 is preferably provided by a material that is easily applied to and removable from the rear surface 120, e.g., an adhesive tape.

Figure 6B:
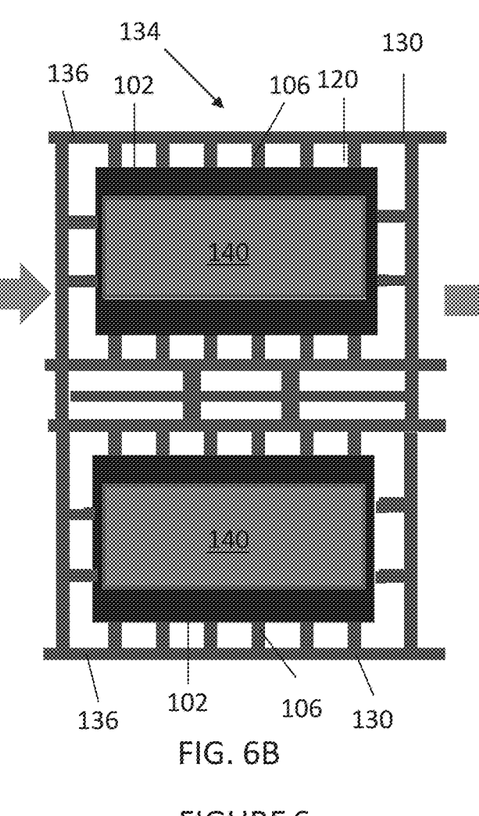

Referring to FIG. 6B, the metal coating 130 is formed on the leads 106. This may be done using an electroplating process, e.g., using the previously described technique. In this case, the non-conductive coating 140 inhibits cations in the aqueous solution form depositing on the rear surface 120 of the heat slug 104. Thus, the non-conductive coating 140 prevents the electroplating process from depositing the metal coating 130 on the rear surface 120 of the heat slug 104. Alternatively, the metal coating 130 can be formed using an electroless plating process. In that case, the non-conductive coating 140 prevents any chemical reaction between the electroless plating solution and the rear surface 120 of the heat slug 104.

Figure 6C:
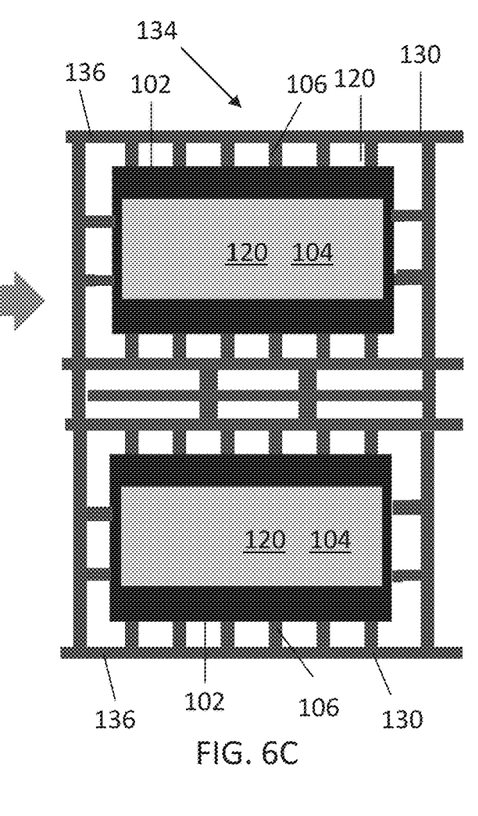

Referring to FIG. 6C, after performing the electroplating process, the non-conductive coating 140 is removed from the rear surface 120. As a result, the rear surface 120 of the heat slug 104 is substantially devoid of the metal coating 130. Consequently, the rear surface 120 of the heat slug 104 can provide the planar metallic heat sink interface surface 132 as described with reference to FIG. 2.

The technique of FIG. 6 allows for the formation of the semiconductor package 100 to be devoid of the metal coating 130 at the rear surface of the heat slug 106 without electrically disconnecting the heat slug. This technique may be used to provide the semiconductor package 100 described with reference to FIG. 4C. In that case, the previously described technique of FIG. 5 of electrically disconnecting the leads 106 from the heat slug 104 (e.g., by severing the tie bars 138) is not feasible, because a connection between the first one 142 of the leads 106 and the heat slug 104 is required.

Figure 7:
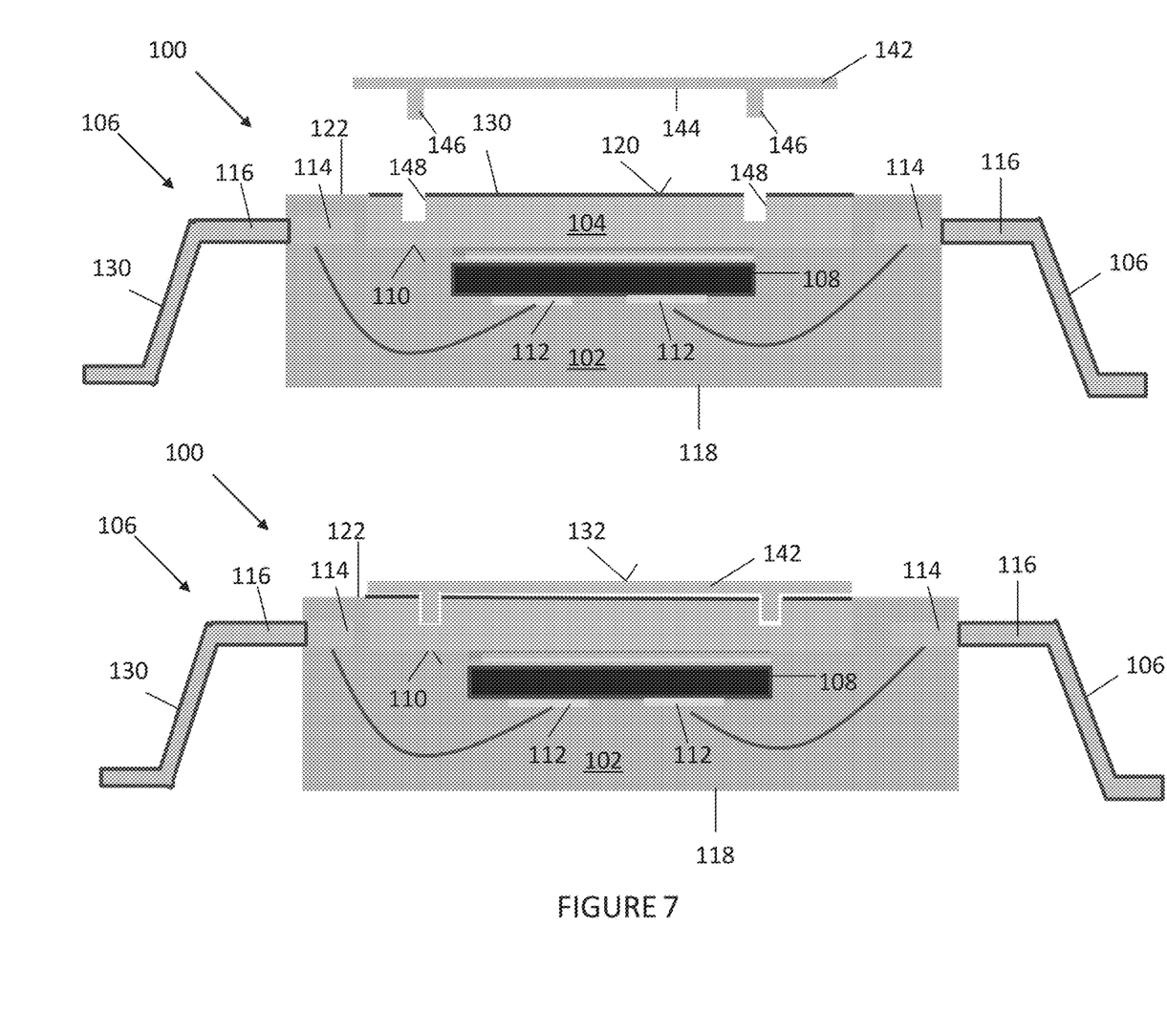
FIG. 7 depicts a technique for providing a heat sink interface that is devoid of the metal coating after performing the electroplating process, according to an embodiment.

Referring to FIG. 7, a technique for providing the semiconductor package 100 with the planar metallic heat sink interface surface 132 is shown, according to another embodiment. Different to the previously described embodiments, the technique of FIG. 7 does not require any measures to be taken prior to the electroplating process to prevent the metal coating 130 from forming on the rear surface 120 of the heat slug 104 e.g., as described with reference to FIGS. 4 and 5. Instead, the technique of FIG. 7 involves processing steps that occur after performing the metal coating 130 process. In FIG. 7, the semiconductor package 100 described with reference to FIG. 4A is shown. Alternatively, the technique of FIG. 7 can be used to provide the semiconductor package 100 as described with reference to FIG. 4O.

According to the technique of FIG. 7, a metallic attachment piece 142 that is separate from the heat slug 104 is provided. The metallic attachment piece 142 can include the same material as the heat slug 104. For example, according to one embodiment, the metallic attachment piece 142 and the heat slug 104 are each formed from copper. After the metal coating 130 is formed on the leads 106 of the semiconductor package 100, the metallic attachment piece 142 is secured to the semiconductor package 100. This is done by directly affixing a lower side 144 of the metallic attachment piece 142 with the rear surface 120 of the heat slug 104 so that the lower side 144 of the metallic attachment piece 142 interfaces with and covers the rear surface 120 of the heat slug 104. In other words, the two components are brought into contact and engage with one another. Optionally, a conductive adhesive, e.g., solder or conductive glue, may be provided between the two components. Once the metallic attachment piece 142 is secured to the heat slug 104, i.e., as shown in the lower figure, the rear surface 120 of the heat slug 104 is covered. According to an embodiment, the metallic attachment piece 142 is at least as large or larger than the exposed rear surface 120 of the heat slug 104. In this way, the metallic attachment piece 142 completely covers any of the metal coating 130 that forms on the rear surface 120 of the heat slug 104 when secured to the heat slug 104. An upper side of the metallic attachment piece 142 that is opposite from the lower side 144 provides the planar metallic heat sink interface surface 132.

In the depicted embodiment, the metallic attachment piece 142 includes a first set 146 of attachment features on its lower side 144 that assist in the formation of a secure connection. This first set 146 of attachment features is configured to engage with a second set 148 of attachment features in the rear surface 120 of the heat slug 104. The second set 148 of attachment features can be formed before or after the metal coating 130 process by a variety of techniques, e.g., stamping, etching, etc. The second set 148 of attachment features have a complementary shape as the first set 146. Moreover, this complementary shape can be configured so that the first set can be inserted in and received by the second set. As a result, the first and second sets 146, 148 of attachment features form an interlocked connection.

More generally, the metallic attachment piece 142 can be secured to the heat slug 104 using any of a variety of techniques and structures. For example, the geometry and number of attachment features can differ from what is shown. Instead of physical interlocking features, conductive adhesives, such as conductive glue, sinter, solder, etc. can be used.

Figure 8:
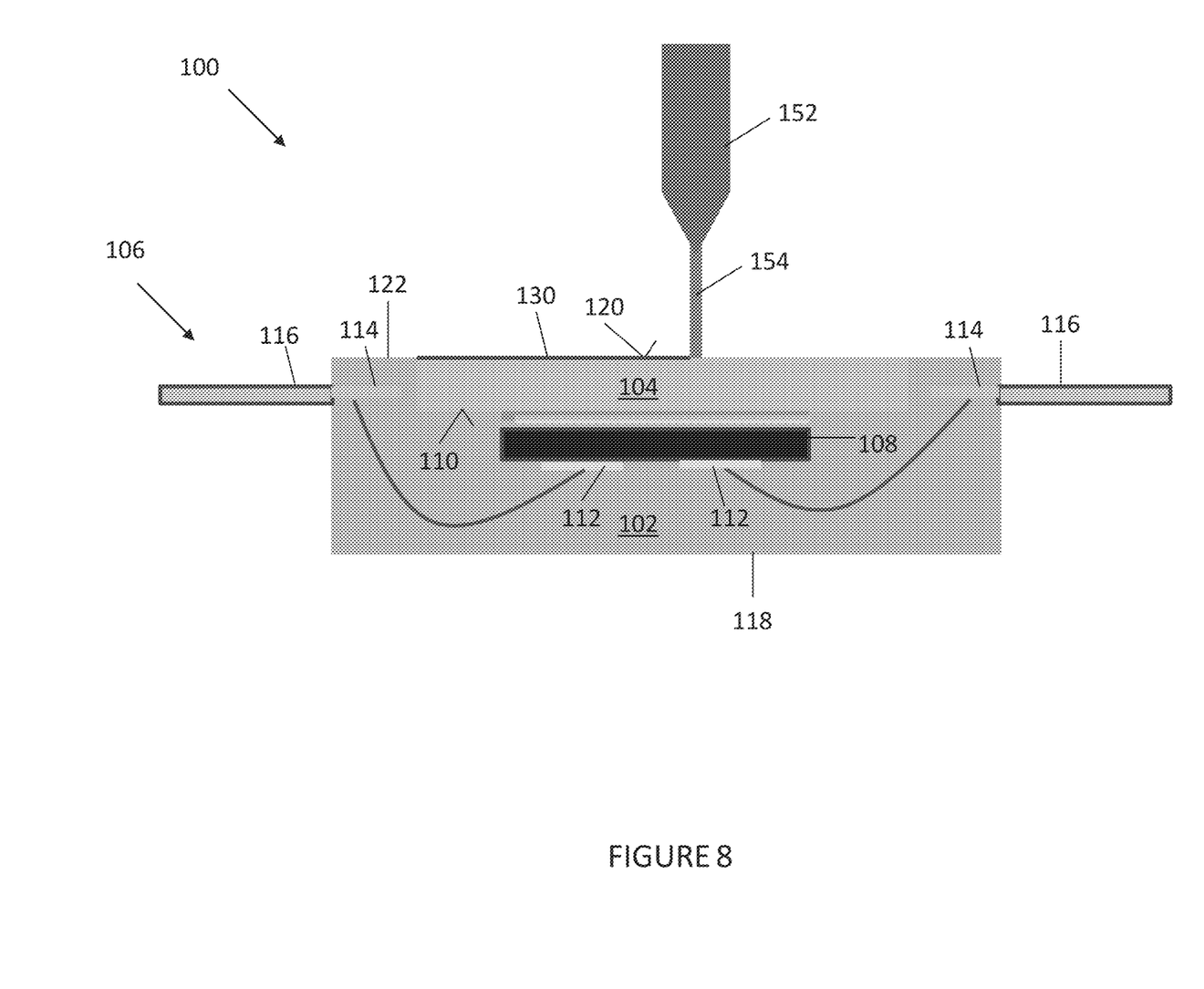
FIG. 8 depicts a technique for providing a heat sink interface that is devoid of the metal coating after performing the electroplating process, according to an embodiment.

Referring to FIG. 8, a technique for providing the semiconductor package 100 with the planar metallic heat sink interface surface 132 is shown, according to another embodiment. Similar to the previously described embodiment of FIG. 7, the technique of FIG. 8 does not require any measures to be taken prior to the electroplating process to prevent the metal coating 130 from forming on the rear surface 120 of the heat slug 104 e.g., as described with reference to FIGS. 4 and 5. Instead, the technique of FIG. 7 involves processing steps that occur after performing the metal coating 130 process. In FIG. 8, the semiconductor package 100 described with reference to FIG. 4A is shown. Alternatively, the technique of FIG. 8 can be used to provide the semiconductor package 100 as described with reference to FIG. 40.

As shown in FIG. 8, the metal coating 130 is removed by performing a laser removal step. Performing the laser removal process includes using a laser device 152 to direct a laser beam 154 on the rear surface 120 of the heat slug 104. FIG. 8 depicts the semiconductor package 100 while the process is being performed such that the metal coating 130 is partially removed from the heat slug 104. Generally speaking, the laser device 152 and the energy density of the laser beam 154 can be selected to provide a sufficient concentration of energy that breaks up the material of the metal coating 130 without substantially damaging the heat slug 104. Hence, after performing the laser removal process, the semiconductor package 100 with the planar metallic heat sink interface surface 132 as previously described is provided.

Referring to FIG. 9, two different options for the laser removal process are shown. Each of these techniques are performed after a lead frame is 134 coated with the metal coating 130, e.g., according to the technique described with reference to FIG. 50. Because no measures are taken to prevent the formation of the metal coating 130 on the heat slug 102, the plating process causes the metal coating 130 to initially directly form on and cover the heat slug 102. Subsequently, the laser device 152 is used to remove this metal coating 130.

Figure 9A:
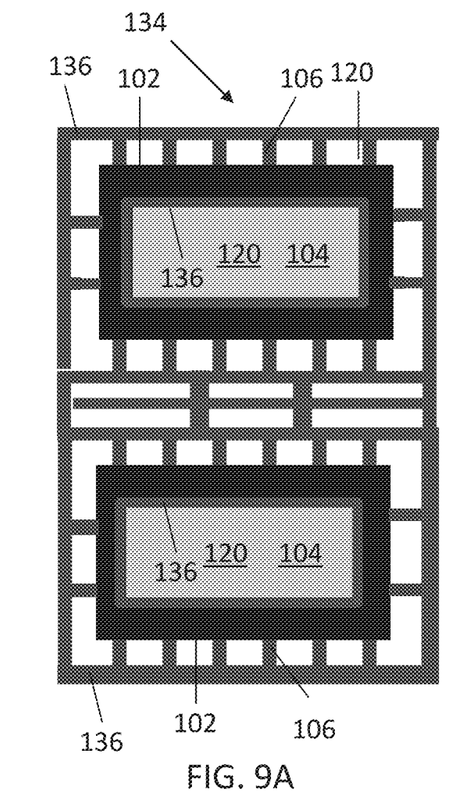
FIGS. 9A and 9B, depicts two different laser removal techniques for removing metal coating from the heat slug.

According to the technique shown in FIG. 9A the laser beam is used to remove a substantial majority of the metal coating 130 from the rear surface 120 of the heat slug 104, e.g., at least 95% of a surface area of the rear surface 120 of the heat slug 104. The remaining metal coating 130 is disposed at the outer edges of the heat slug 104 and thus forms a ring around a central portion of the heat slug 104, which is exposed from the metal coating 130 and provides the planar metallic heat sink interface surface 132 as previously described. The purpose of performing the laser removal process this way is to ensure that any energy of the laser beam 152 does not reach the mold compound body 102. That is, the ring of metal coating 130 acts as a buffer to ensure that the laser beam 152 is only applied to the heat slug 104. To this end, the width of the metal coating 130 in a direction parallel to the rear surface 120 may be selected to be greater than precision tolerances of the laser process, e.g., between about 50 nm and 150 nm, and the thickness of the metal coating 130 in a direction perpendicular to the rear surface 120 may be selected to be between about 0.5 µm and 15.0 µm.

Figure 9B:
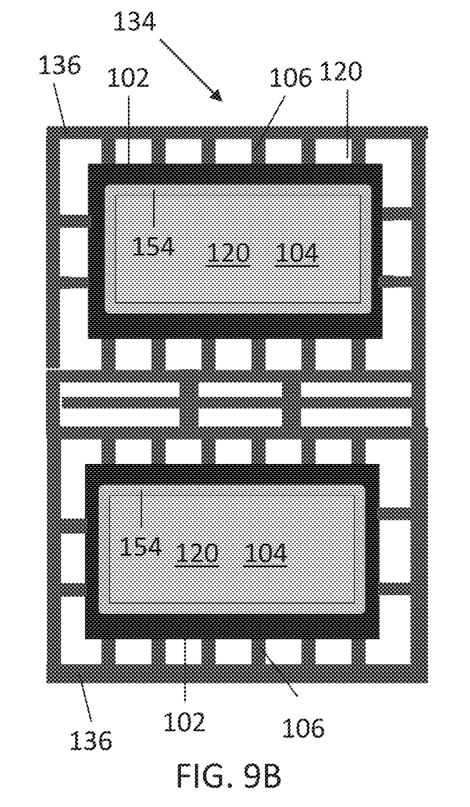

According to the technique shown in FIG. 9B, the laser beam is used to completely remove the metal coating 130 from the rear surface 120 of the heat slug 104. Hence, the planar metallic heat sink interface surface 132 is coextensive with the complete rear surface 120 of the heat slug 104. The laser process may have a precision tolerance window such that it is not possible to precisely remove all of the metal coating 130 without directing some laser energy on the immediately adjacent mold compound body 102. FIG. 9B depicts a groove 154 which may form in the mold compound body 102 that is immediately adjacent to the heat slug 104 as result of this effect. Hence, in applications wherein planarity of the mold compound body 102 is desirable, it may be preferable to use the technique described with reference to FIG. 9A. Alternatively, if a maximum area of the planar metallic heat sink interface surface 132 relative to the area of the semiconductor package 100 is more important than the formation of the groove 124, the technique described with reference to FIG. 9B may be preferable.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, comprising:
providing a semiconductor package comprising an electrically insulating mold compound body, a semiconductor die that is encapsulated by the mold compound body, a plurality of electrically conductive leads that each protrude out of the mold compound body, and a metal heat slug, the metal heat slug comprising a rear surface that is exposed from the mold compound body;
coating outer portions of the leads that are exposed from the mold compound body with a metal coating; and
after completing the coating of the outer portions of the leads, providing a planar metallic heat sink interface surface on the semiconductor device which is:
exposed from the mold compound body; and
substantially devoid of the metal coating.

2. The method of claim 1, wherein the planar metallic heat sink interface surface and the electrically conductive leads are each formed from a first metal, and wherein the metal coating comprises a second metal having higher solderability than the first metal.

3. The method of claim 2, wherein the planar metallic heat sink interface surface and the electrically conductive leads are each formed from copper, and wherein the metal coating comprises at least one of: gold, nickel, tin, and silver.

4. The method of claim 1, wherein the planar metallic heat sink interface surface is provided by the rear surface of the heat slug, wherein coating the outer portions of the leads comprises an electroplating process, and wherein providing the planar metallic heat sink interface surface to be substantially devoid of the metal coating comprises preventing the electroplating process from depositing the metal coating on the rear surface of the heat slug.

5. The method of claim 4, wherein the lead frame is provided to include a peripheral ring and a tie bar, each of the leads being connected to the peripheral ring and physically separated from the heat slug, the tie bar being connected between the peripheral ring and the heat slug, and wherein preventing the electroplating process from depositing the metal coating on the rear surface of the heat slug comprises severing the tie bar prior to performing the electroplating process.

6. The method of claim 4, wherein the lead frame is provided to include a peripheral ring with at least one of the leads being physically connected between the peripheral ring and the heat slug, and wherein preventing the electroplating process from depositing the metal coating on the rear surface of the heat slug comprises applying a non-conductive coating on the rear surface of the heat slug prior to performing the electroplating process.

7. The method of claim 1, wherein providing the planar metallic heat sink interface surface comprises:
providing a metallic attachment piece that is separate from the heat slug; and
attaching the metallic attachment piece to the rear surface of the heat slug after coating the outer portions of the leads with the metal coating.

8. The method of claim 7, wherein coating the outer portions of the leads comprises an electroplating process, wherein the electroplating process forms the metal coating on the rear surface of the heat slug, and wherein the metallic attachment piece completely covers the metal coating on the rear surface once attached to the heat slug.

9. The method of claim 7, wherein attaching the metallic attachment piece to the rear surface comprises directly affixing the metallic attachment piece to the rear surface such that a lower side of the metallic attachment piece interfaces with and covers the rear surface of the heat slug, wherein an upper side of the metallic attachment piece that is opposite from the lower side provides the planar metallic heat sink interface surface.

10. The method of claim 9, wherein the lower side of the attachment piece comprises a first set of attachment features, wherein the rear surface of the heat slug comprises a second set of attachment features, wherein the first and second sets of attachment features are complementary shaped, and wherein the attachment piece is secured to the heat slug by forming an interlocked connection between the first and second sets of attachment features.

11. The method of claim 1, wherein the metal coating forms directly on the rear surface of the heat slug during the coating of the outer portions of the leads, and wherein providing the planar metallic heat sink interface comprises removing the metal coating that forms directly on the rear surface of the heat slug.

12. The method of claim 11, wherein removing the metal coating that forms directly on the rear surface of the heat slug comprises performing a laser removal process that removes the metal coating with a laser beam.

13. The method of claim 12, wherein the metal coating is removed from a central portion of the heat slug such that a ring of the metal coating that extends to outer edges of the heat slug remains on the heat slug after the laser removal process.

14. The method of claim 12, wherein the metal coating is completely removed from the hear slug.

15. A method of forming a semiconductor device, comprising:
providing a semiconductor package comprising an electrically insulating mold compound body, a semiconductor die that is encapsulated by the mold compound body, a plurality of electrically conductive leads that each protrude out of the mold compound body, and a metal heat slug, the metal heat slug comprising a rear surface that is exposed from the mold compound body;
performing an electroplating process on the semiconductor package that forms a metal coating on the outer portions of the leads that are exposed from the mold compound body; and
preventing the metal coating from forming on the rear surface of the heat slug during the electroplating process.

16. The method of claim 15, wherein performing the electroplating process comprises submerging the leads and the rear surface of the semiconductor package in an aqueous solution, and wherein preventing the metal coating from forming on the rear surface comprises electrically disconnecting the heat slug from the leads before performing the electroplating process.

17. The method of claim 16, wherein the semiconductor package is provided on a lead frame comprising a peripheral ring and a tie bar, each of the leads being connected to the peripheral ring and disconnected from the heat slug, the tie bar being connected between the peripheral ring and the heat slug, and wherein electrically disconnecting the heat slug from the leads comprises severing the tie bar.

18. The method of claim 16, wherein preventing the metal coating from forming on the rear surface of the heat slug comprises applying a non-conductive adhesive on the on the rear surface of the heat slug prior to performing the electroplating process.

19. A packaged semiconductor device, comprising:
an electrically insulating mold compound body;
a metal heat slug comprising a rear surface that is exposed from the mold compound body and a die attach surface opposite the rear surface;
a semiconductor die that is encapsulated by the mold compound body and mounted on the heat slug;
a plurality of electrically conductive leads, each of the leads comprising outer portions that are exposed from the mold compound body;
a metal coating covering the outer portions of each of the leads; and
a planar metallic heat sink interface surface which is:
exposed from the mold compound body;
thermally coupled to the semiconductor die via the heat slug; and
substantially devoid of the metal coating.

20. The packaged semiconductor device of claim 19, wherein the planar metallic heat sink interface surface and the electrically conductive leads are each formed from a first metal, and wherein the metal coating comprises a second metal having higher solderability than the first metal.

21. The packaged semiconductor device of claim 19, wherein the rear surface of the heat slug provides the planar metallic heat sink interface surface.

22. The packaged semiconductor device of claim 19, further comprising a metallic attachment piece that is separate from the heat slug and is secured to the heat slug at its lower side, and wherein an upper side of the metallic attachment piece provides the planar metallic heat sink interface surface.

23. The packaged semiconductor device of claim 19, wherein the metal coating is additionally formed on the rear surface of the heat slug in a ring that surrounds a central portion of the heat slug which is exposed form the metal coating.

24. The packaged semiconductor device of claim 19, further comprising a groove formed in the mold compound body, wherein the groove surrounds the rear surface of the heat slug, and wherein the rear surface of the heat slug is completely devoid of the metal coating.

\* \* \* \* \*

UNITED STATES PATENT AND TRADEMARK OFFICE
CERTIFICATE OF CORRECTION

PATENT NO. : 10,651,109 B2
APPLICATION NO. : 16/504692
DATED : May 12, 2020
INVENTOR(S) : Abd Hamid et al.

Page 1 of 1

It is certified that error appears in the above-identified patent and that said Letters Patent is hereby corrected as shown below:

In the Claims

Column 14, Lines 24-25, (approx.) (Claim 18) please change "on the on the rear" to -- on the rear --

Signed and Sealed this
Eleventh Day of August, 2020

Andrei Iancu
*Director of the United States Patent and Trademark Office*